(12) United States Patent
Liu et al.

(10) Patent No.: US 8,478,197 B2
(45) Date of Patent: Jul. 2, 2013

(54) WIRELESS TRANSCEIVER MODULE

(75) Inventors: I-Ru Liu, Taiwan (TW); Ting-I Tsai, Taiwan (TW); Wen-Pin Lo, Taiwan (TW); Tung-Kai Chang, Taiwan (TW); Hsiao-Chien Chou, Taiwan (TW); Ming-Yi Shen, Taiwan (TW)

(73) Assignee: Accton Technology Corporation, Hsinchu (TW)

( * ) Notice: Subject to any disclaimer, the term of this patent is extended or adjusted under 35 U.S.C. 154(b) by 705 days.

(21) Appl. No.: 12/582,310

(22) Filed: Oct. 20, 2009

(65) Prior Publication Data

US 2010/0099357 A1 Apr. 22, 2010

(30) Foreign Application Priority Data

Oct. 20, 2008 (TW) ................................ 97140114 A

(51) Int. Cl.
*H04B 7/00* (2006.01)
(52) U.S. Cl.
USPC ......................................... 455/41.2; 324/678
(58) Field of Classification Search
USPC ................. 455/41.2, 550.1; 257/713
See application file for complete search history.

(56) References Cited

U.S. PATENT DOCUMENTS

| 7,875,956 B2* | 1/2011 | Koutsaroff et al. ........... 257/535 |
| 8,110,899 B2* | 2/2012 | Reed et al. ..................... 257/621 |
| 8,178,953 B2* | 5/2012 | Barth et al. .................... 257/659 |
| 2004/0178482 A1* | 9/2004 | Bolken et al. ................. 257/678 |
| 2008/0315404 A1* | 12/2008 | Eichelberger et al. ........ 257/713 |
| 2010/0158296 A1* | 6/2010 | Dumas et al. ................. 381/328 |
| 2010/0216410 A1* | 8/2010 | Liu et al. ........................ 455/73 |

* cited by examiner

*Primary Examiner* — Nay A Maung
*Assistant Examiner* — Angelica M Perez
(74) *Attorney, Agent, or Firm* — Morris Manning & Martin LLP; Tim Tingkang Xia, Esq.

(57) ABSTRACT

A wireless transceiver module has a plurality of through holes and includes a wireless network chip, a circuit substrate, a Bluetooth chip, and a plurality of conductive connection structures. The Bluetooth chip is disposed between the circuit substrate and the wireless network chip, and the through holes are formed by passing through the wireless network chip, the circuit substrate, and the Bluetooth chip. The conductive connection structures are respectively disposed in the through hole. With the conductive connection structures, the Bluetooth chip, the wireless network chip, and the circuit substrate are electrically connected with each another.

19 Claims, 7 Drawing Sheets

WIRELESS TRANSCEIVER MODULE

CROSS-REFERENCE TO RELATED APPLICATION

This application claims the benefit of Taiwan Patent Application No. 097140114, filed on Oct. 20, 2008, which is hereby incorporated by reference for all purposes as if fully set forth herein.

BACKGROUND OF THE INVENTION

1. Field of the Invention

The present invention relates to a wireless module, and in particular to a wireless transceiver module.

2. Related Art

In the contemporary wireless communication technology, a wireless transceiver module provided with functions of both Bluetooth transmission and wireless network such as Wireless Local Area Network (for example WiFi), Wireless Metropolitan Area Network (for example WiMAX), or Wireless Wide Area Network (for example) 3GPP has been developed. The wireless transceiver module may be installed in an electronic apparatus such as a laptop computer, a mobile Internet device (MID), and a smart phone to enable the electronic apparatus to perform Bluetooth transmissions and to connect wireless networks.

FIG. 1 is a schematic sectional view of a conventional wireless transceiver module. Referring to FIG. 1, a conventional wireless transceiver module 100 includes a plurality of electronic components and a carrier 110. The electronic components include a Bluetooth chip package 120, a wireless network chip package 130, an active component set 140, a passive component set 150, and an antenna unit 160. The electronic components are all assembled on the carrier 110 by using the surface mounted technology (SMT).

The wireless transceiver module 100 may be assembled on a mother board in an electronic apparatus such as a laptop computer, an MID, or a smart phone by using the ball grid array packaging technology (BGA packaging technology). As such, the wireless transceiver module 100 may operate normally.

Currently, most electronic apparatuses, such as the laptop computer, MID or smart phone, are developed to be a tendency toward a small size and thin thickness. To satisfy this tendency, the wireless transceiver module 100 is also required to achieve the miniaturization tendency. Accordingly, it has become an issue that deserves the discussion to reduce the areas, which are occupied by the electronic components, including the Bluetooth chip package 120, the wireless network chip package 130, the active component set 140, the passive component set 150, and the antenna unit 160, on the carrier 110.

SUMMARY OF THE INVENTION

The invention is directed to a wireless transceiver module to reduce an area occupied by electronic components on a carrier.

The invention provides a wireless transceiver module. The wireless transceiver module has a plurality of through holes, and includes a wireless network chip, a first circuit substrate, a Bluetooth chip, and a plurality of conductive connection structures. The Bluetooth chip is disposed between the first circuit substrate and the wireless network chip, and the through holes are formed by passing through the wireless network chip, the first circuit substrate, and the Bluetooth chip. The conductive connection structures are respectively disposed in the through holes. By way of the conductive connection structures, the Bluetooth chip, the wireless network chip, and the first circuit substrate are electrically connected with one another.

Through the conductive connection structures in the through holes, the Bluetooth chip, the wireless network chip, and the circuit substrate such as a first circuit substrate, a second circuit substrate, and a third circuit substrate form a stack, so as to reduce the area occupied by the Bluetooth chip, the wireless network chip, and the circuit substrate on a circuit carrier.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 1:
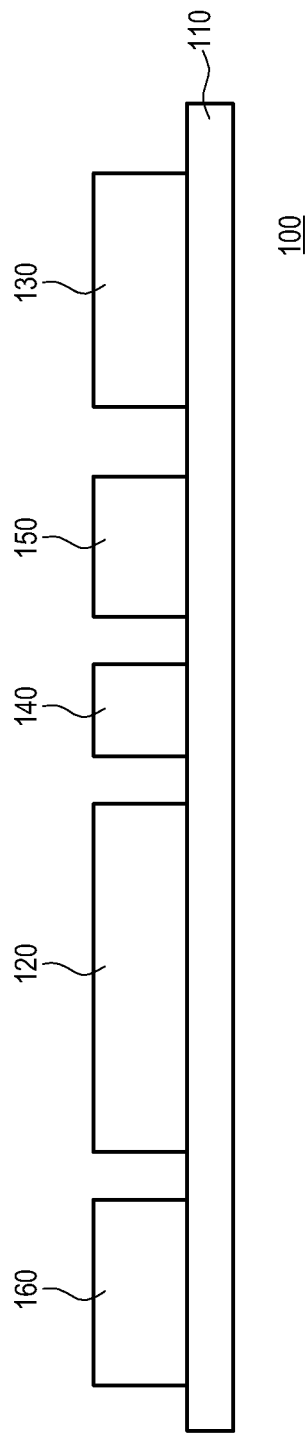
FIG. 1 is a schematic cross-sectional view of a conventional wireless transceiver module.

In the description below, components with like or similar functions and structures are indicated with like reference numerals and designations throughout various embodiments to maintain consistency in description of the present invention.

First Embodiment

Figure 2:
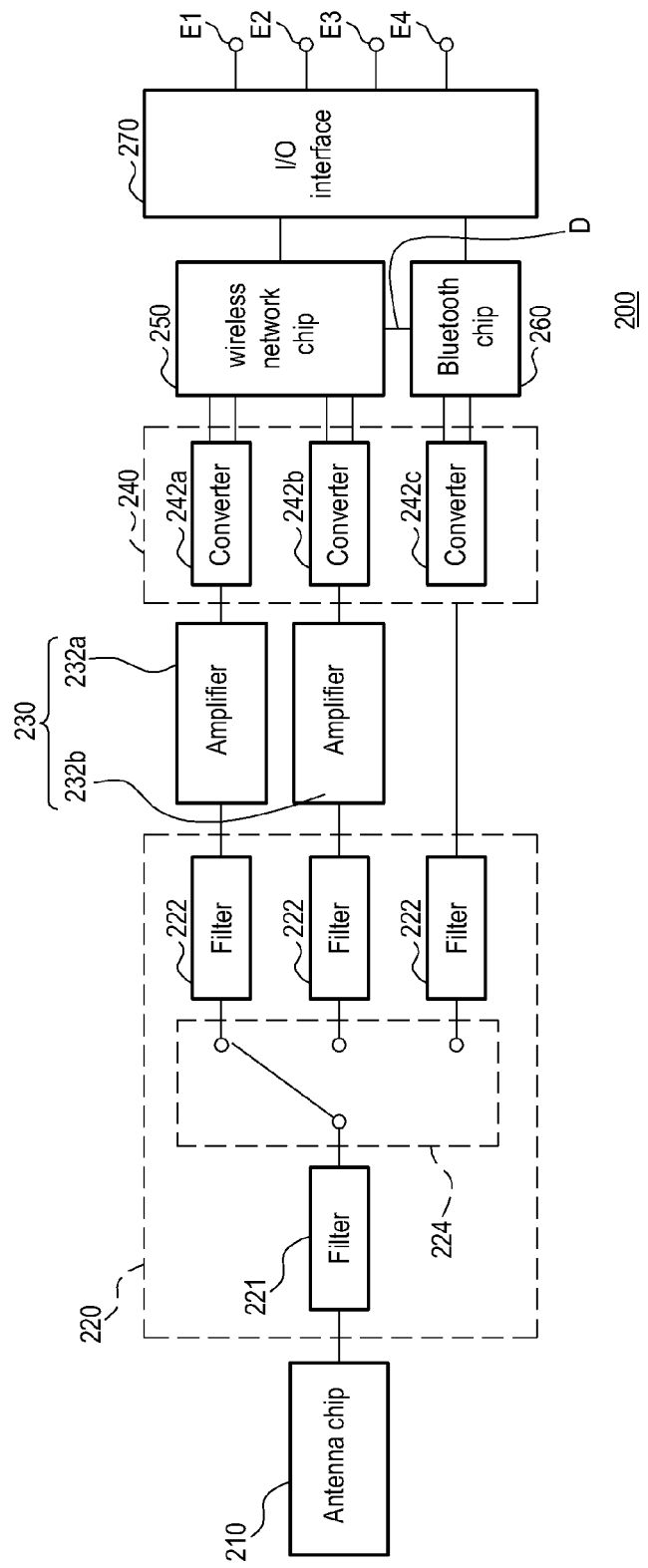
FIG. 2 is a schematic block diagram of the circuit of a wireless transceiver module according to a first embodiment of the present invention.

FIG. 2 is a schematic block diagram of the circuit of a wireless transceiver module according to a first embodiment. Referring to FIG. 2, a wireless transceiver module 200 includes an antenna chip 210, an antenna switch 220, a radio frequency front-end (RF front-end) 230, an RF (radio frequency) interface 240, a wireless network chip 250, a Bluetooth chip 260, and an input/output interface (I/O interface) 270.

The antenna chip 210 is electrically connected to the antenna switch 220 and capable of receiving and transmitting electromagnetic wave signals. Specifically, the antenna chip 210 can receive and convert an electromagnetic wave signal into an electric signal, and further output the electric signal to the antenna switch 220. Moreover, the antenna chip 210 can also convert an electric signal from the antenna switch 220 into an electromagnetic wave signal for transmission.

The electromagnetic wave signals include a Bluetooth signal and a wireless network signal. Here, a WiFi signal taken as an example of the wireless network signal. The frequencies of the electromagnetic wave signals are in a range of the Industrial Scientific Medical Band (ISM Band), and the frequencies of the Bluetooth signal and the wireless network signal are mostly overlapped.

The antenna switch 220 is electrically connected to the RF front-end 230, and includes a plurality of filters 221 and 222 and a switch 224. The filters 221 and 222 are electrically connected to the switch 224. The filter 221 is electrically connected between the switch 224 and the antenna chip 210, and the filters 222 are electrically connected between the RF front-end 230 and the switch 224. The filters 221 and 222 filter the electric signals to filter out noise.

The switch 224 may be a single pole three throw switch (SP3T switch) as shown in FIG. 2. The switch 224 can switch the transmission path of the electric signal, such that the electric signal from the antenna chip 210 is input into either the wireless network chip 250 or the Bluetooth chip 260. Also, since the transmission path of the electric signal is switched by the switch 224, electric signals output by the wireless network chip 250 and the Bluetooth chip 260 are also transmitted to the antenna chip 210 via the switch 224 such that the antenna chip 210 can transmit Bluetooth signals or wireless network signals.

The RF front-end 230 includes amplifiers 232a and 232b. Two of the filters 222 are electrically connected to the amplifiers 232a and 232b respectively. The amplifier 232a receives wireless network signals, and the amplifier 232b transmits the wireless network signals. The amplifier 232a may be a power amplifier (PA) and the amplifier 232b may be a low noise amplifier (LNA).

The RF interface 240 is electrically connected to the RF front-end 230 and includes converters 242a, 242b, and 242c. The converter 242a is electrically connected to the amplifier 232a, the converter 242b is electrically connected to the amplifier 232b, and the converter 242c is directly electrically connected to another filter 222.

The converters 242a, 242b, and 242c may all be a balanced-unbalanced converter (such as balun). In addition, the converters 242a, 242b, and 242c may all include a filter. Thus, the converters 242a, 242b, and 242c provide not only the conversion function between balanced and unbalanced signals but also the filtering function.

Both the wireless network chip 250 and the Bluetooth chip 260 are electrically connected between the RF interface 240 and the I/O interface 270. The wireless network chip 250 is electrically connected to the converters 242a and 242b, and the Bluetooth chip 260 is electrically connected to the converter 242c.

The wireless network chip 250 and the Bluetooth chip 260 can output electric signals according to a wireless network signal and a Bluetooth signal in the electromagnetic wave signals respectively, and the electric signals are input into a control unit via the I/O interface 270. Here, the control unit may be a central processing unit (CPU).

The I/O interface 270 includes a power distributor, a clock distributor, and a plurality of end points E1, E2, E3, and E4. The power distributor can output electric power to the control unit via the end point E1. The clock distributor can generate a clock and output the clock to the control unit via the end point E4.

The wireless network chip 250 and the Bluetooth chip 260 can output electric signals to the control unit from the end points E2 and E3 respectively, wherein the end point E2 may be a Secure Digital Input/Output (SDIO) and the end point E3 may be connected to a Universal Asynchronous Receiver/Transmitter (UART). Further, the wireless network chip 250 and the Bluetooth chip 260 can also output electric signals to the antenna chip 210 such that the antenna chip 210 transmits a wireless network signal and a Bluetooth signal.

It should be noted that the wireless network chip 250 is electrically connected to the Bluetooth chip 260 through a hand-shake D capable of controlling the wireless network chip 250 and the Bluetooth chip 260 to receive and transmit electromagnetic wave signals. Particularly, since the bands of the wireless network signal and the Bluetooth signal are partially overlapped, the wireless network chip 250 and the Bluetooth chip 260 may interfere with each other if the electromagnetic wave signals are received and transmitted by the wireless network chip 250 and the Bluetooth chip 260 at the same time.

However, the hand-shake D can control the wireless network chip 250 and the Bluetooth chip 260 so that the electromagnetic wave signals received and transmitted by the wireless network chip 250 and the Bluetooth chip 260 are staggered in the time domain or frequency domain. In this way, the interference between the wireless network chip 250 and the Bluetooth chip 260 in receiving and transmitting electromagnetic wave signals is alleviated.

Figure 3:
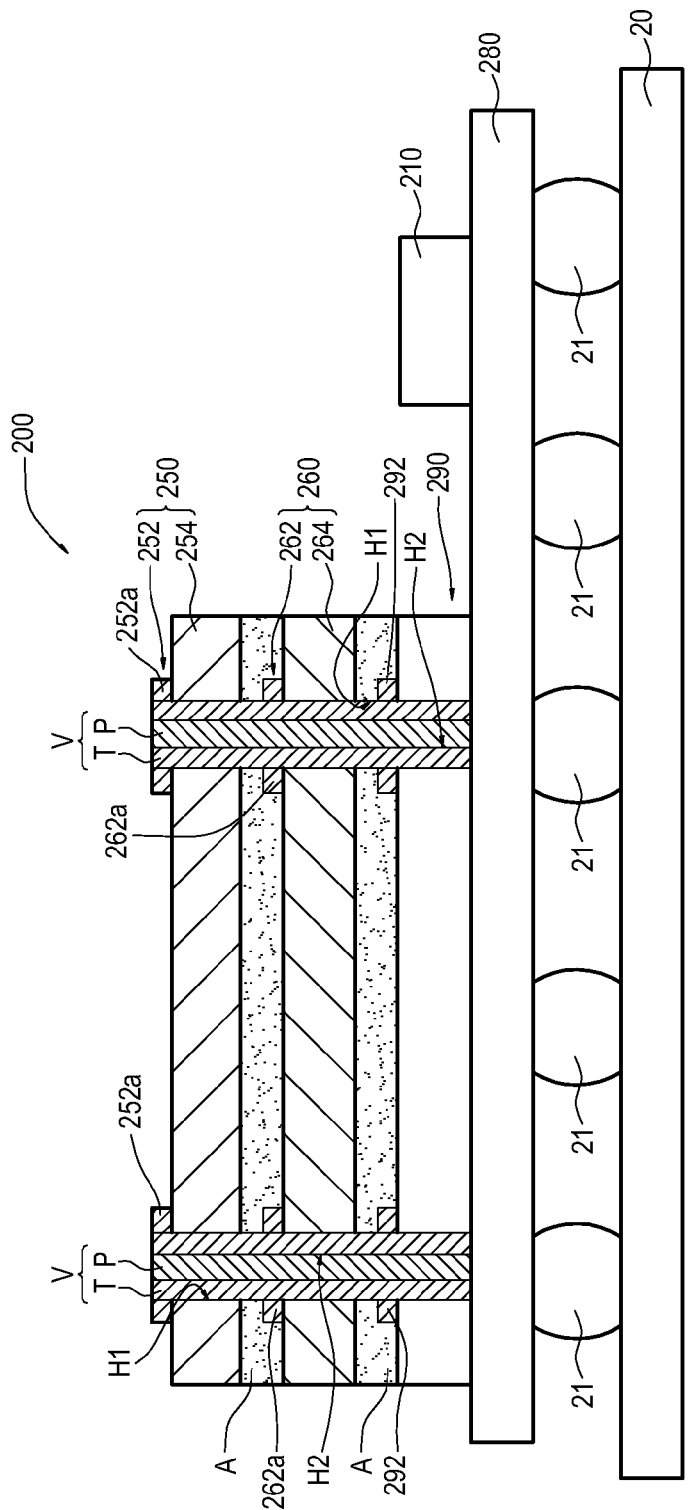
FIG. 3 is a schematic cross-sectional view of the wireless transceiver module in FIG. 2.

FIG. 3 is a schematic cross-sectional view of the wireless transceiver module in FIG. 2. Referring to FIGS. 2 and 3, the wireless transceiver module 200 further includes a circuit carrier 280 and a first circuit substrate 290. The Bluetooth chip 260 is disposed and electrically connected between the wireless network chip 250 and the first circuit substrate 290.

Both the first circuit substrate 290 and the antenna chip 210 are disposed on the circuit carrier 280. Accordingly, the first circuit substrate 290 is disposed between the Bluetooth chip 260 and the circuit carrier 280. The first circuit substrate 290 and the antenna chip 210 are both electrically connected to the circuit carrier 280. The material for the first circuit substrate 290 may be silicon, silicon germanium (SiGe), or Gallium arsenide (GaAs).

The wireless network chip 250, the Bluetooth chip 260, and the first circuit substrate 290 may all be unpackaged chips. Further, the wireless network chip 250 and the Bluetooth chip 260 are chips treated with a redistribution process. Therefore, the wireless network chip 250 may include a first redistribution layer (RDL) 252 and a wireless network chip body 254 that are electrically connected with each another.

In view of the above, the Bluetooth chip 260 may also include a second RDL 262 and a Bluetooth chip body 264 which are also electrically connected with each another. In addition, the first RDL 252 includes a plurality of first bonding pads 252a, the second RDL 262 includes a plurality of second bonding pads 262a, and the first circuit substrate 290 includes a plurality of third bonding pads 292.

The Bluetooth chip 260 may be bonded between the wireless network chip 250 and the first circuit substrate 290 so that the Bluetooth chip 260, the wireless network chip 250, and the first circuit substrate 290 are stacked. Specifically, the wireless transceiver module 200 may further include a plurality of adhesive layers A. One of the adhesive layers A is connected between the Bluetooth chip 260 and the wireless network chip 250, and another one of the adhesive layers A is connected between the Bluetooth chip 260 and the first circuit substrate 290.

In view of the above, the Bluetooth chip 260 is bonded between the wireless network chip 250 and the first circuit substrate 290 through the adhesive layers A. Further, the material for the adhesive layers A may be a high molecular material or metal. Particularly, the adhesive layers A may be connected between the Bluetooth chip 260 and the wireless network chip 250 and between the Bluetooth chip 260 and the first circuit substrate 290 through anodic bonding, fusion bonding, direct bonding, or eutectic bonding.

In this embodiment, the wireless transceiver module 200 further includes a plurality of conductive connection structures V and a plurality of through holes H1. Specifically, the through holes H1 are extended from the wireless network chip 250 to the first circuit substrate 290. That is, the through holes H1 are all formed by passing through the Bluetooth chip 260, the wireless network chip 250, and the first circuit substrate 290.

The conductive connection structures V are disposed in the through holes H1 respectively and are electrically connected to the first bonding pads 252a, the second bonding pads 262a, and the third bonding pads 292. The conductive connection structures V may be of Through Silicon Via (TSV) structure. The Bluetooth chip 260, the wireless network chip 250, and the first circuit substrate 290 are electrically connected with one another through the conductive connection structures V.

In view of the above, the conductive connection structures V may be a cylinder body. Specifically, each of the conductive connection structures V may include a conductive tube T and a conductive cylinder P. Each conductive tube T has a via-hole H2. The conductive cylinders P are located in the conductive tubes T respectively and fill the via-holes H2 respectively.

Various processes can be adopted to fabricate the conductive connection structures V. For example, after the Bluetooth chip 260 is bonded between the wireless network chip 250 and the first circuit substrate 290, a drilling process may be performed to form the through holes H1. The drilling process may be laser drilling which uses a carbon dioxide laser or an ultraviolet laser.

Next, electroless plating and electroplating processes are performed to form the conductive tubes T. Thereafter, a conductive adhesive is filled within the via-holes H2 to form the conductive cylinders P. The conductive adhesive may be copper glue or a silver paste. So far, the conductive connection structures V are approximately completed.

In the wireless transceiver module 200 shown in FIG. 2, the antenna switch 220, the RF front-end 230, the RF interface 240, and the I/O interface 270 can be integrated into the first circuit substrate 290 and the circuit carrier 280. Particularly, the antenna switch 220, the RF front-end 230, and the I/O interface 270 can be composed of passive components such as a plurality of capacitors, a plurality of inductors, and a plurality of resistors. The passive components may be formed in the first circuit substrate 290 and the circuit carrier 280 to form the antenna switch 220, the RF front-end 230, and the I/O interface 270.

For example, the I/O interface 270 may be composed of the passive components provided in both the first circuit substrate 290 and the circuit carrier 280. That is, the I/O interface 270 may be integrated in the first circuit substrate 290 and the circuit carrier 280. In addition, the circuit carrier 280 may be a circuit board with embedded passive components.

The first circuit substrate 290 and the antenna chip 210 are disposed on the circuit carrier 280, and may be further bonded with the circuit carrier 280. Particularly, the first circuit substrate 290 and the antenna chip 210 may both be bonded with the circuit carrier 280 by using the surface mounted technology, wire bonding, or a plurality of solder bulks, such as solder balls. Moreover, since the circuit carrier 280 may be a circuit board with embedded passive components, the antenna chip 210 may be embedded in the circuit carrier 280.

The wireless transceiver module 200 may be assembled on and electrically connected to a circuit board 20. Specifically, the wireless transceiver module 200 may be assembled on the circuit board 20 through a plurality of solder bulks 21, such as solder balls. That is, the solder bulks 21 are used for bonding the wireless transceiver module 200 and the circuit board 20. Further, the circuit board 20 may be a mother board in an electronic apparatus such as a laptop computer, an MID, or a smart phone.

It should be noted that the Bluetooth chip 260 is bonded between the wireless network chip 250 and the first circuit substrate 290. After the conductive connection structures V are formed, a chip stack substantially formed by the Bluetooth chip 260, the wireless network chip 250, the first circuit substrate 290, and the conductive connection structures V can be directly delivered and sold to downstream packagers.

Second Embodiment

Figure 4A:
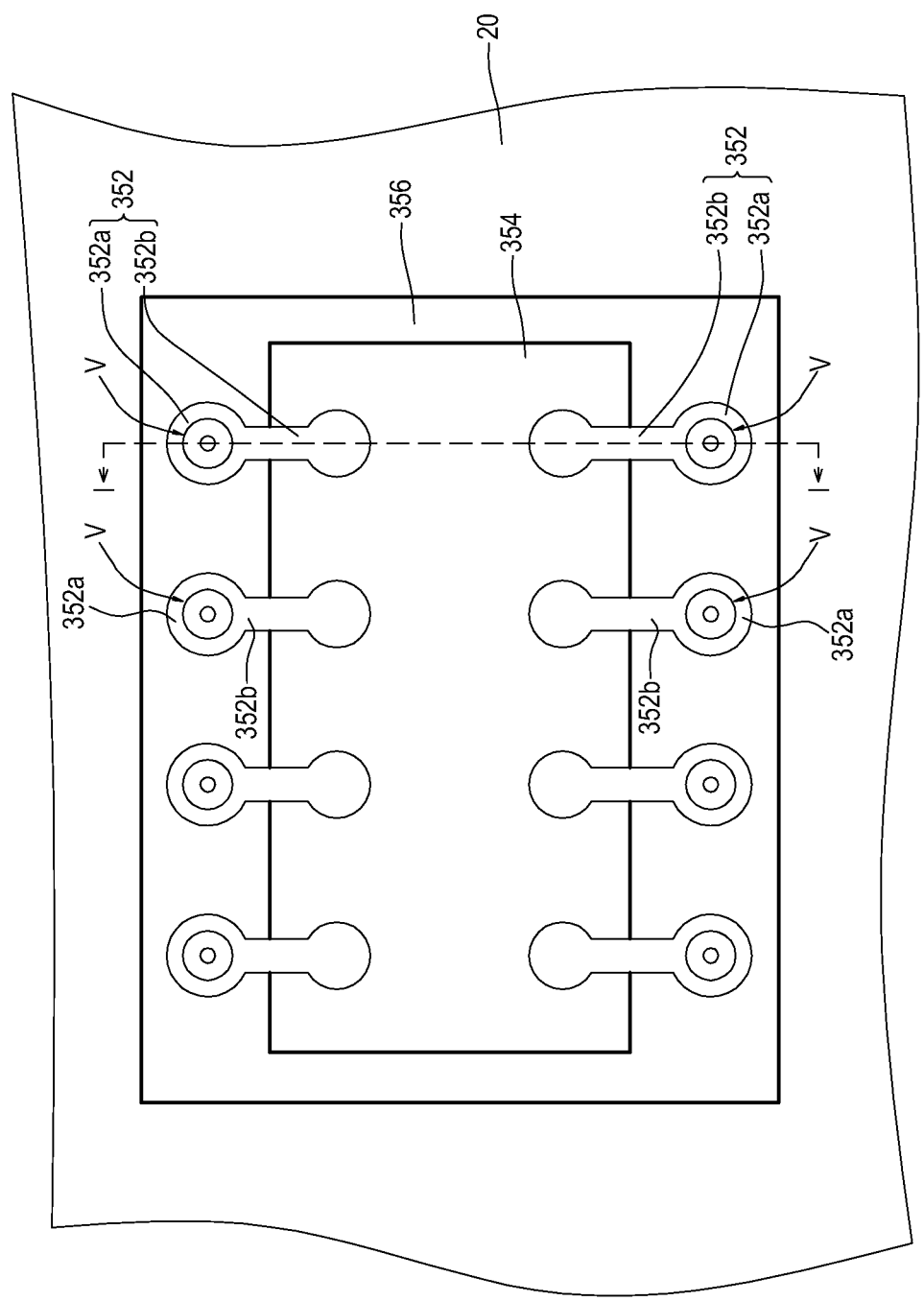
FIG. 4A is a schematic top view of a wireless transceiver module according to a second embodiment of the present invention.
Figure 4B:
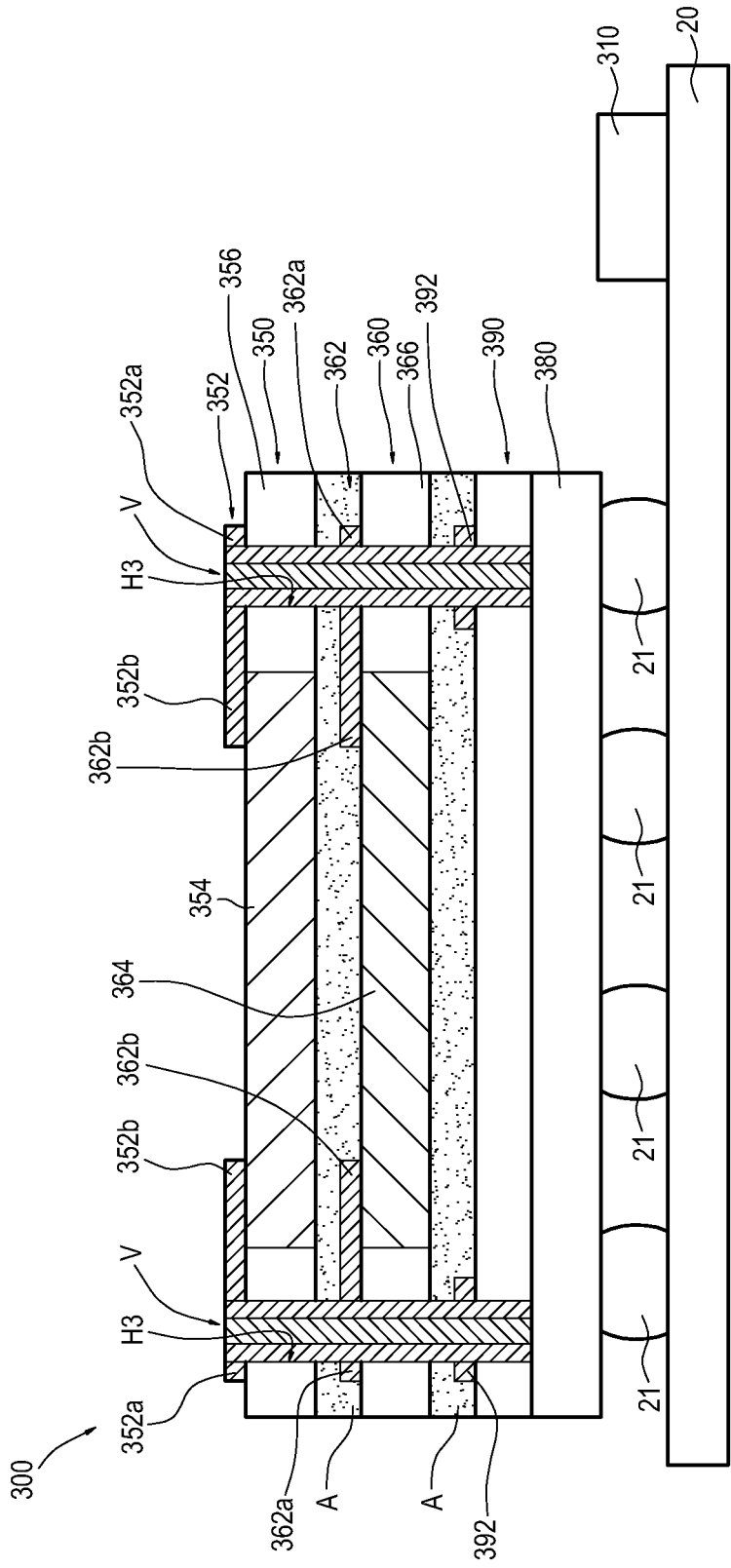
FIG. 4B is a schematic cross-sectional view taken along a line I-I in FIG. 4A.

FIG. 4A is a schematic top view of a wireless transceiver module according to a second embodiment, and FIG. 4B is a schematic cross-sectional view taken along a line I-I in FIG. 4A. Referring to FIGS. 4A and 4B, the wireless transceiver module 300 in this embodiment is similar to the wireless transceiver module 200 in the first embodiment. Thus, the difference between the wireless transceiver module 300 and the wireless transceiver module 200 will be described in detail below.

The wireless transceiver module 300 includes a wireless network chip 350, a Bluetooth chip 360, a circuit carrier 380, a first circuit substrate 390, and a plurality of adhesive layers A. The Bluetooth chip 360 is electrically connected between the first circuit substrate 390 and the wireless network chip 350. The Bluetooth chip 360 is bonded between the first circuit substrate 390 and the wireless network chip 350 through the adhesive layers A.

The first circuit substrate 390 is disposed on and electrically connected to the circuit carrier 380. The type and the inner circuit of the circuit carrier 380 are the same as those of the circuit carrier 280 in the previous embodiment. That is, the circuit carrier 380 may be a circuit board with embedded passive components.

The wireless transceiver module 300 has a plurality of through holes H3 extended from the wireless network chip 350 to the first circuit substrate 390, and further includes a plurality of conductive connection structures V in the through holes H3. The Bluetooth chip 360, the wireless network chip 350, and the first circuit substrate 390 are electrically connected with one another through the conductive connection structures V.

Specifically, the wireless network chip 350 includes a first RDL 352, a wireless network chip body 354, and a first edge portion 356. The Bluetooth chip 360 includes a second RDL 362, a Bluetooth chip body 364, and a second edge portion 366. The first edge portion 356 is corresponding to the second edge portion 366, and neither of the first and second edge portions 356 and 366 has circuit therein.

The through holes H3 are extended from the first edge portion 356 to the first circuit substrate 390 via the second edge portion 366. That is, the through holes H3 are formed by through the first edge portion 356, the second edge portion 366, and the first circuit substrate 390, but not formed by passing through the Bluetooth chip body 364 and the wireless network chip body 354.

Therefore, the through holes H3 are not located in the Bluetooth chip body 364 or the wireless network chip body 354 but in the first edge portion 356 and the second edge portion 366. Also, the processes of fabricating the through holes H3 and the conductive connection structures V are the same as those in the previous embodiment. Additionally, neither of the first edge portion 356 and the second edge portion 366 has circuit therein. The inner circuits of the wireless network chip body 354 and the Bluetooth chip body 364 are prevented from being damaged while forming the through holes H3 in this embodiment.

The first RDL 352 includes a plurality of first bonding pads 352a and a plurality of first connection wires 352b. The first bonding pads 352a are disposed on the first edge portion 356, and the first connection wires 352b are electrically connected between the first bonding pads 352a and the wireless network chip body 354. The second RDL 362 includes a plurality of second bonding pads 362a and a plurality of second connection wires 362b. The second bonding pads 362a are disposed on the second edge portion 366, and the second connection wires 362b are electrically connected between the second bonding pads 362a and the Bluetooth chip body 364.

In view of the above, the first circuit substrate 390 includes a plurality of third bonding pads 392, and the conductive connection structures V are electrically connected to the first bonding pads 352a, the second bonding pads 362a, and the third bonding pads 392. As such, the Bluetooth chip 360, the wireless network chip 350, and the first circuit substrate 390 are electrically connected with one another.

In this embodiment, the first edge portion 356 and the second edge portion 366 may be formed by reserving the edge of a die during wafer dicing. Here, the die refers to the Bluetooth chip body 364 or the wireless network chip body 354. Thus, both the first edge portion 356 and the wireless network chip body 354 may be formed from the same wafer, and both the second edge portion 366 and the Bluetooth chip body 364 may also be formed from the same wafer. That is, the first edge portion 356 and wireless network chip body 354 may be of a same material, and the second edge portion 366 and the Bluetooth chip body 364 may also be of a same material.

Also, the first edge portion 356 and the second edge portion 366 may be a same frame made of silicon or glass. After dicing the wafer to form a plurality of dies, the dies may be mounted in the first edge portion 356 or the second edge portion 366 respectively to form the Bluetooth chip 360 and the wireless network chip 350. Additionally, the first edge portion 356 and the wireless network chip body 354 may be of different materials, and the second edge portion 366 and the Bluetooth chip body 364 may also be of different materials.

Thus it can be seen that since the first edge portion 356 and the second edge portion 366 have no circuit therein, no additional space for the through holes H3 is required in the Bluetooth chip body 364 and the wireless network chip body 354, and the density of the inner circuits in both the Bluetooth chip body 364 and the wireless network chip body 354 is increased.

Further, as the conductive connection structures V are located in the first edge portion 356 and the second edge portion 366 in this embodiment, the conductive connection structures V are not restricted by the inner circuits in the Bluetooth chip body 364 and the wireless network chip body 354 during manufacture. In other words, the conductive connection structures V in this embodiment are applicable to various types of Bluetooth chips and wireless network chips.

Moreover, the wireless transceiver module 300 may be assembled on the circuit board 20 through the plurality of solder bulks 21, and an antenna chip 310 is disposed on the circuit board 20. The antenna chip 310 may be indirectly and electrically connected to the wireless network chip 350 and the Bluetooth chip 360 through the circuit board 20, the solder bulks 21, and the circuit carrier 380. As such, the antenna chip 310 can still work with the wireless network chip 350 and the Bluetooth chip 360 to receive and transmit electromagnetic wave signals.

Third Embodiment

Figure 5:
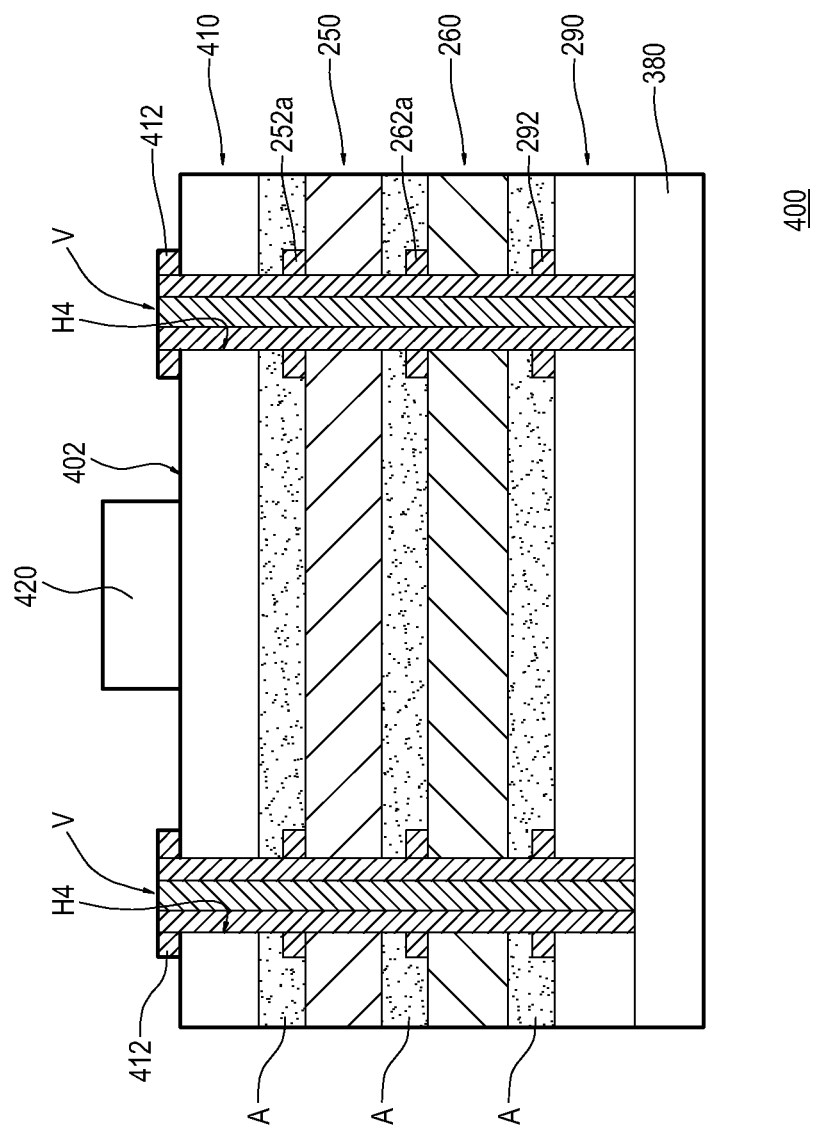
FIG. 5 is a schematic cross-sectional view of a wireless transceiver module according to a third embodiment of the present invention.

FIG. 5 is a schematic cross-sectional view of a wireless transceiver module according to a third embodiment. Referring to FIG. 5, a wireless transceiver module 400 in this embodiment is similar to the wireless transceiver module 200 in the first embodiment, while the difference between both lies in that the wireless transceiver module 400 further includes a second circuit substrate 410 that may be an unpackaged chip treated with a redistribution process, and is made of a material such as silicon, silicon germanium (SiGe), or Gallium arsenide (GaAs).

The wireless transceiver module 400 includes a wireless network chip 250, a Bluetooth chip 260, a first circuit substrate 290, a circuit carrier 380, a second circuit substrate 410, and a plurality of conductive connection structures V, and has a plurality of through holes H4. The second circuit substrate 410 is disposed on the wireless network chip 250. The through holes H4 are extended from the second circuit substrate 410 to the first circuit substrate 290 via the wireless network chip 250 and the Bluetooth chip 260. That is, the through holes H4 are formed by passing through the second circuit substrate 410, the wireless network chip 250, the Bluetooth chip 260, and the first circuit substrate 290. The conductive connection structures V are disposed in the through holes H4 respectively.

The second circuit substrate 410 is bonded with the wireless network chip 250. Specifically, the wireless transceiver module 400 may further include a plurality of adhesive layers A, and one of the adhesive layers A is connected between the second circuit substrate 410 and the wireless network chip 250. Therefore, the second circuit substrate 410 is bonded with the wireless network chip 250 through the adhesive layers A.

The second circuit substrate 410 includes a plurality of fourth bonding pads 412. The conductive connection structures V are electrically connected to the fourth bonding pads 412, the first bonding pads 252a, the second bonding pads 262a, and the third bonding pads 292. Therefore, with the conductive connection structures V, the second circuit substrate 410 can be electrically connected to the wireless network chip 250, and the Bluetooth chip 260, the wireless network chip 250, the first circuit substrate 290, and the second circuit substrate 410 can be electrically connected with one another.

In addition, in this embodiment, the wireless network chip 250 and the Bluetooth chip 260 in the wireless transceiver module 400 may be the wireless network chip 350 and the Bluetooth chip 360 in the second embodiment (please refer to FIG. 4A) respectively. That is, the wireless network chip 250 and the Bluetooth chip 260 in the wireless transceiver module 400 may each include a first edge portion and a second edge portion in which the conductive connection structures V are located.

The circuit architecture of the wireless transceiver module 400 is the same as that of the wireless transceiver module 200 in FIG. 2. Specifically, in embodiments, the wireless transceiver module 400 further includes components, such as an antenna switch, an RF front-end, an RF interface, and I/O interface, which are not shown. The electric connection between such components is the same as that in FIG. 2, and is not described again here.

In view of above, the antenna switch, the RF front-end, the RF interface, and the I/O interface may be integrated in the first circuit substrate 290, the circuit carrier 380, and the second circuit substrate 410. For example, the antenna switch and the RF front-end may be integrated in the second circuit substrate 410 where the I/O interface for the wireless transceiver module 400 may be integrated in the first circuit substrate 290 and the circuit carrier 380. Also, the RF interface may be integrated into one of the first circuit substrate 290, the second circuit substrate 410, and the circuit carrier 380.

The wireless transceiver module 400 may further include an antenna chip 420 disposed on the second circuit substrate 410. The antenna chip 420 is electrically connected to and bonded with the second circuit substrate 410. Since the antenna switch and the RF front-end may be integrated in the second circuit substrate 410, the antenna chip 420 can be directly and electrically connected to the antenna switch and the RF front-end such that the transmission path of the electric signal from the antenna chip 420 to the RF front-end is shortened to reduce the generation of the noise, thereby improving the transmission quality of the electric signal.

It should be noted that in other embodiments which are not shown, an upper surface 402 of the wireless transceiver module 400 may be covered by a packaging gel capable of sealing the antenna chip 420 and completely covering the second circuit substrate 410 to protect the antenna chip 420. Further, the upper surface 402 of the wireless transceiver module 400 may also be covered by a metal cover, which covers the second circuit substrate 410 and has an opening of exposing the antenna chip 420.

Fourth Embodiment

Figure 6:
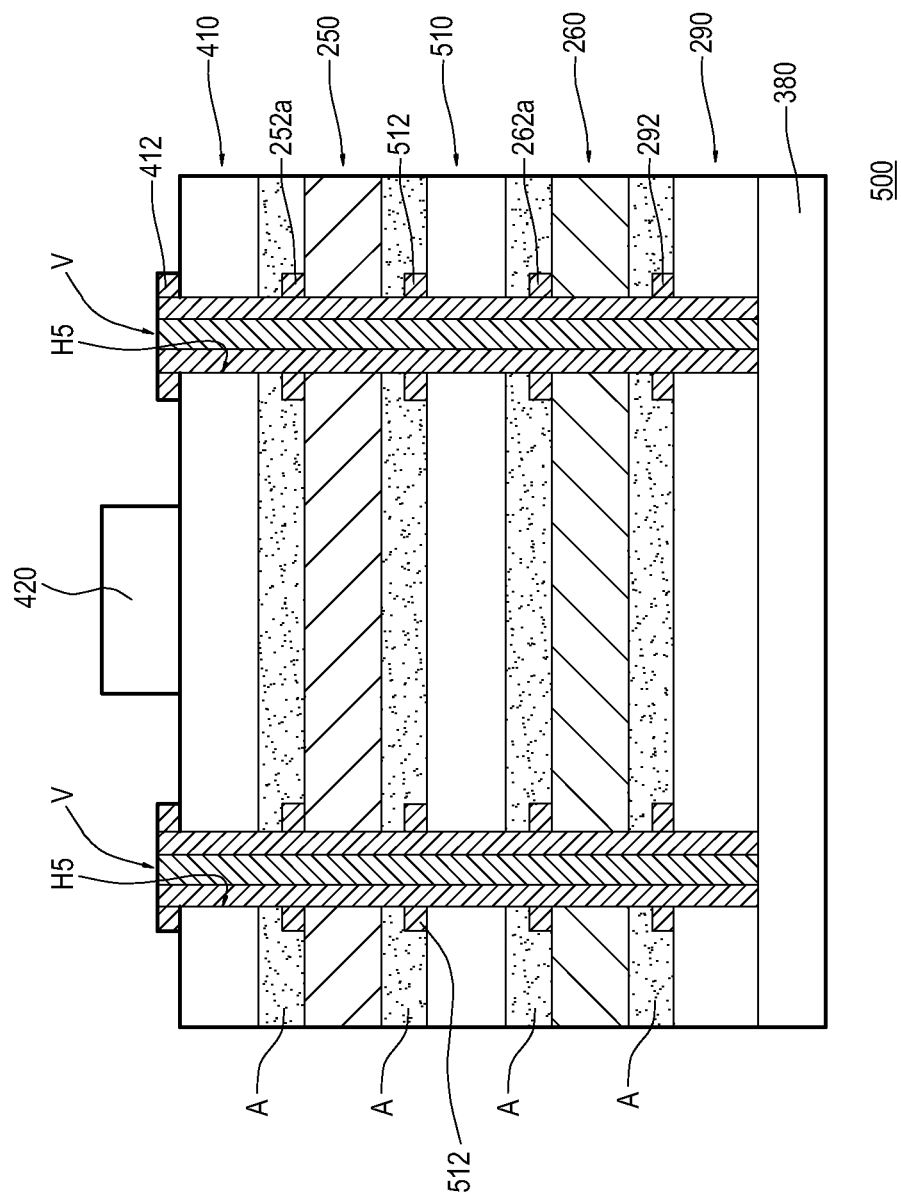
FIG. 6 is a schematic cross-sectional view of a wireless transceiver module according to a fourth embodiment of the present invention.

FIG. 6 is a schematic cross-sectional view of a wireless transceiver module according to a fourth embodiment. Referring to FIG. 6, a wireless transceiver module 500 in this embodiment is similar to the wireless transceiver module 400 in the third embodiment, while the difference between both lies in that the wireless transceiver module 500 further includes a third circuit substrate 510, which may be an unpackaged chip treated with a redistribution process, and is made of a material of silicon, silicon germanium (SiGe), or Gallium arsenide (GaAs).

The wireless transceiver module 500 includes a wireless network chip 250, a Bluetooth chip 260, a first circuit substrate 290, a circuit carrier 380, a second circuit substrate 410, an antenna chip 420, a third circuit substrate 510, and a plurality of conductive connection structures V, and has a plurality of through holes H5. The third circuit substrate 510 is disposed between the wireless network chip 250 and the Bluetooth chip 260. The through holes H5 are extended from the second circuit substrate 410 to the first circuit substrate 290 via the wireless network chip 250, the third circuit substrate 510, and the Bluetooth chip 260. That is, the through holes H5 are formed by passing through the second circuit substrate 410, the wireless network chip 250, the third circuit substrate 510, the Bluetooth chip 260, and the first circuit substrate 290. The conductive connection structures V are disposed in the through holes H5 respectively.

The third circuit substrate 510 is electrically connected between the wireless network chip 250 and the Bluetooth chip 260, and may be bonded between the wireless network chip 250 and the Bluetooth chip 260. Specifically, the wireless transceiver module 500 may further include a plurality of adhesive layers A. One of the adhesive layers A is connected between the wireless network chip 250 and the third circuit substrate 510, and another one of the adhesive layers A is connected between the Bluetooth chip 260 and the third circuit substrate 510. The third circuit substrate 510 is bonded between the wireless network chip 250 and the Bluetooth chip 260 through the adhesive layers A.

The third circuit substrate 510 includes a plurality of fifth bonding pads 512. The conductive connection structures V are electrically connected to the fifth bonding pads 512, the first bonding pads 252a, the second bonding pads 262a, the third bonding pads 292, and the fourth bonding pads 412. Therefore, the Bluetooth chip 260, the wireless network chip 250, the first circuit substrate 290, the second circuit substrate 410, and the third circuit substrate 510 can be electrically connected with one another through the conductive connection structures V.

In addition, the wireless network chip 250 and the Bluetooth chip 260 in the wireless transceiver module 500 may be the wireless network chip 350 and the Bluetooth chip 360 in the second embodiment (please refer to FIG. 4A) respectively. That is, the wireless network chip 250 and the Bluetooth chip 260 in the wireless transceiver module 500 may each include a first edge portion and a second edge portion in which the conductive connection structures V are located.

The circuit architecture of the wireless transceiver module 500 is the same as that of the wireless transceiver module 200 shown in FIG. 2. Specifically, in other embodiments, the wireless transceiver module 500 further includes components, such as an antenna switch, an RF front-end, an RF interface, and an I/O interface, that are not shown. The components which are not shown are integrated in the first circuit substrate 290, the second circuit substrate 410, the third circuit substrate 510, and the circuit carrier 380.

For example, the I/O interface for the wireless transceiver module 500 may be integrated in the first circuit substrate 290 and the circuit carrier 380. The antenna switch and the RF front-end may be integrated in the second circuit substrate 410 where the RF interface may be integrated in the third circuit substrate 510. Also, the electrical connection among the antenna switch, the RF front-end, the RF interface, and the I/O interface is the same as that of FIG. 2, and is not described again here.

To sum up, with a plurality of through holes and the conductive connection structures disposed in the through holes, the Bluetooth chip, the wireless network chip, and at least one circuit substrate such as a first circuit substrate, a second circuit substrate, and a third circuit substrate can be stacked and bonded to form a stack. Furthermore, the antenna switch, the RF front-end, the RF interface, and the I/O interface can be integrated in at least one circuit substrate and the circuit carrier. As such, the area occupied by the Bluetooth chip, the wireless network chip, and the circuit substrate on the circuit carrier may be reduced to meet the development trend of miniaturization.

The above descriptions of the preferred embodiments are only intended to illustrate the present invention, but not to limit the present invention. Various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wireless transceiver module, having a plurality of through holes, comprising:
    a wireless network chip comprising a first redistribution layer and a wireless network chip body electrically connected to the first redistribution layer;
    a first circuit substrate;
    a Bluetooth chip comprising a second redistribution layer and a Bluetooth chip body electrically connected to the second redistribution layer, and the Bluetooth chip disposed between the first circuit substrate and the wireless network chip, wherein the through holes are formed by passing through the wireless network chip, the first circuit substrate, and the Bluetooth chip; and a plurality of conductive connection structures respectively disposed in the through holes, wherein the Bluetooth chip, the wireless network chip, and the first circuit substrate are electrically connected with one another through the conductive connection structures, wherein the first redistribution layer comprises a plurality of first bonding pads electrically connected to the conductive connection structures, and the second redistribution layer comprises a plurality of second bonding pads electrically connected to the conductive connection structures.

2. The wireless transceiver module according to claim 1, wherein each of the conductive connection structures comprises a conductive tube and a conductive cylinder, and each of the conductive tubes has a via-hole, and the via-holes are filled with the conductive cylinders respectively.

3. The wireless transceiver module according to claim 1, further comprising a circuit carrier, wherein the first circuit substrate is disposed on the circuit carrier and electrically connected to the circuit carrier.

4. The wireless transceiver module according to claim 3, further comprising an antenna chip disposed on the circuit carrier and electrically connected to the circuit carrier.

5. The wireless transceiver module according to claim 1, wherein the first circuit substrate comprises a plurality of third bonding pads electrically connected to the conductive connection structures.

6. The wireless transceiver module according to claim 1, wherein the wireless network chip further comprises a first edge portion, and the Bluetooth chip further comprises a second edge portion, and the first edge portion is corresponding to the second edge portion, the first edge portion and the second edge portion have no circuits, and the through holes are formed by passing through the first edge portion, the second edge portion, and the first circuit substrate.

7. The wireless transceiver module according to claim 6, wherein the first edge portion and the second edge portion is a frame.

8. The wireless transceiver module according to claim 7, wherein a material of the first edge portion and the second edge portion is silicon or glass.

9. The wireless transceiver module according to claim 6, wherein the first edge portion and the wireless network chip body are of a same material.

10. The wireless transceiver module according to claim 6, wherein the second edge portion and the Bluetooth chip body are of a same material.

11. The wireless transceiver module according to claim 6, wherein the first redistribution layer further comprises a plurality of first connection wires, and the first bonding pads are disposed on the first edge portion, and the first connection wires are electrically connected between the first bonding pads and the wireless network chip body, the second redistribution layer further comprises a plurality of second connection wires, and the second bonding pads are disposed on the second edge portion, and the second connection wires are electrically connected between the second bonding pads and the Bluetooth chip body.

12. A wireless transceiver module, having a plurality of through holes, comprising:

a wireless network chip comprising a first redistribution layer and a wireless network chip body, wherein the first redistribution layer is electrically connected to the wireless network chip body, and comprises a plurality of first bonding pads;

a first circuit substrate;

a Bluetooth chip disposed between the first circuit substrate and the wireless network chip, wherein the through holes are formed by passing through the wireless network chip, the first circuit substrate, and the Bluetooth chip, and the Bluetooth chip comprises a second redistribution layer and a Bluetooth chip body, and the second redistribution layer is electrically connected to the Bluetooth chip body and comprises a plurality of second bonding pads;

a plurality of conductive connection structures disposed in the through holes respectively, wherein the Bluetooth chip, the wireless network chip, and the first circuit substrate are electrically connected with one another through the conductive connection structures, and the first circuit substrate comprises a plurality of third bonding pads, and the first bonding pads, the second bonding pads, and the third bonding pads are electrically connected to the conductive connection structures; and a second circuit substrate disposed on the wireless network chip.

13. The wireless transceiver module according to claim 12, wherein the through holes are formed by passing through the second circuit substrate, the wireless network chip, the Bluetooth chip, and the first circuit substrate.

14. The wireless transceiver module according to claim 12, further comprising an antenna chip disposed on the second circuit substrate and electrically connected to the second circuit substrate.

15. The wireless transceiver module according to claim 12, wherein the second circuit substrate comprises a plurality of fourth bonding pads electrically connected to the conductive connection structures.

16. A wireless transceiver module, having a plurality of through holes, comprising:

a wireless network chip comprising a first redistribution layer and a wireless network chip body, wherein the first redistribution layer is electrically connected to the wireless network chip body, and comprises a plurality of first bonding pads;

a first circuit substrate;

a Bluetooth chip disposed between the first circuit substrate and the wireless network chip, wherein the through holes are formed by passing through the wireless network chip, the first circuit substrate, and the Bluetooth chip, and the Bluetooth chip comprises a second redistribution layer and a Bluetooth chip body, and the second redistribution layer is electrically connected to the Bluetooth chip body and comprises a plurality of second bonding pads;

a second circuit substrate disposed on the wireless network chip, and comprising a plurality of fourth bonding pads;

a plurality of conductive connection structures disposed in the through holes respectively, wherein the Bluetooth chip, the wireless network chip, and the first circuit substrate are electrically connected with one another through the conductive connection structures, and the first circuit substrate comprises a plurality of third bonding pads, and the first bonding pads, the second bonding pads, the third bonding pads, and the fourth bonding pads are electrically connected to the conductive connection structures; and a third circuit substrate disposed between the wireless network chip and the Bluetooth chip.

17. The wireless transceiver module according to claim 16, wherein the through holes are formed by passing through the second circuit substrate, the wireless network chip, the third circuit substrate, the Bluetooth chip, and the first circuit substrate.

18. The wireless transceiver module according to claim 16, wherein the third circuit substrate comprises a plurality of fifth bonding pads electrically connected to the conductive connection structures.

19. The wireless transceiver module according to claim 16, further comprising an antenna chip disposed on the second circuit substrate and electrically connected to the second circuit substrate.

\* \* \* \* \*